(12) United States Patent
Baniecki et al.

(10) Patent No.: US 10,858,745 B2
(45) Date of Patent: Dec. 8, 2020

(54) PHOTOCHEMICAL ELECTRODE AND OXYGEN EVOLUTION DEVICE

(71) Applicant: FUJITSU LIMITED, Kawasaki (JP)

(72) Inventors: John David Baniecki, Zama (JP); Hiroyuki Aso, Atsugi (JP); Yoshihiko Imanaka, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 135 days.

(21) Appl. No.: 15/685,469

(22) Filed: Aug. 24, 2017

(65) Prior Publication Data
US 2018/0057951 A1 Mar. 1, 2018

(30) Foreign Application Priority Data
Aug. 31, 2016 (JP) ................. 2016-169734

(51) Int. Cl.
| | | |
|---|---|---|
| C25B 11/04 | (2006.01) | |
| C01G 23/00 | (2006.01) | |
| C01F 11/00 | (2006.01) | |
| C01G 35/00 | (2006.01) | |
| C25B 1/00 | (2006.01) | |
| C25B 1/04 | (2006.01) | |
| C23C 14/34 | (2006.01) | |

(52) U.S. Cl.
CPC .......... *C25B 11/0426* (2013.01); *C01F 11/00* (2013.01); *C01G 23/002* (2013.01); *C01G 23/006* (2013.01); *C01G 35/006* (2013.01); *C25B 1/003* (2013.01); *C25B 1/04* (2013.01); *C23C 14/3485* (2013.01); *Y02E 60/36* (2013.01)

(58) Field of Classification Search
CPC .. C25B 1/003; C25B 1/02–1/12; C25B 11/00; C25B 11/04; C25B 11/041; C25B 11/0426; C25B 11/0442; C25B 11/0478–11/110494; B01J 23/755; B01J 23/10
See application file for complete search history.

(56) References Cited

U.S. PATENT DOCUMENTS

| | | | |
|---|---|---|---|
| 2012/0285823 A1 | 11/2012 | Suzuki et al. | |
| 2013/0008495 A1* | 1/2013 | Jun | ......................... C25B 1/003 136/255 |
| 2014/0374270 A1* | 12/2014 | Minegishi | ............... C25B 1/003 205/340 |

(Continued)

FOREIGN PATENT DOCUMENTS

| | | |
|---|---|---|
| JP | 2015-098644 | 5/2015 |
| WO | 2011/089904 | 7/2011 |

OTHER PUBLICATIONS

PhysicsNet ("Photoelectric Effect", 2012) (Year: 2012).*

(Continued)

*Primary Examiner* — Alexander W Keeling
(74) *Attorney, Agent, or Firm* — Fujitsu Patent Center

(57) ABSTRACT

A photochemical electrode includes: an optical absorption layer; a catalyst layer for oxygen evolution reaction over the optical absorption layer; and a conducting layer over the catalyst layer. A valance band maximum of the catalyst layer is higher than a valance band maximum of the optical absorption layer. A work function of the conducting layer is larger than a work function of the catalyst layer.

11 Claims, 4 Drawing Sheets

(56) References Cited

U.S. PATENT DOCUMENTS

2015/0111119 A1    4/2015  Tamura et al.
2015/0218719 A1*   8/2015  Deguchi .................. B01J 27/24
                                                  205/340

OTHER PUBLICATIONS

Li et al ("Ultraviolet photovoltaic effect in BiFeO3/Nb—SrTiO3 heterostructure", Journal of Applied Physics, 112, pp. 083506-1-083506-4, 2012) (Year: 2012).*

Qu et al ("Resistance switching and white-light photovoltaic effects in heterojunctions", Applied Physics Letters, 98, pp. 173507-1-173507-3, 2011) (Year: 2011).*

Skotheim et al ("Photoelectrochemical Behavior of n-Si Electrodes Protected with Pt-Polypyrrole", Journal of the Electrochemical Society, 129, 8, pp. 1737-1741, 1982) (Year: 1982).*

JPOA—Office Action of Japanese Patent Application No. 2016-169734 dated Feb. 25, 2020, with full machine translation. **References cited in the JPOA were previously submitted in the IDS filed on Aug. 24, 2017.

* cited by examiner

PHOTOCHEMICAL ELECTRODE AND OXYGEN EVOLUTION DEVICE

CROSS-REFERENCE TO RELATED APPLICATION

This application is based upon and claims the benefit of priority of the prior Japanese Patent Application No. 2016-169734, filed on Aug. 31, 2016, the entire contents of which are incorporated herein by reference.

FIELD

The embodiments discussed herein are directed to a photochemical electrode and an oxygen evolution device.

BACKGROUND

Researches have been made on technology for oxygen evolution through water splitting. This technology generates pairs of electrons and holes in an optical absorption layer and produces oxygen gas at an anode-side photochemical electrode. Therefore, what are important to obtain high splitting efficiency is that the light is led to the optical absorption layer highly efficiently and that the activity of a catalyst is high. It is also important that the photochemical electrode is chemically stable in an aqueous electrolyte since an electrolyte is added to the water for the water splitting. If a photochemical electrode is not chemically stable, splitting efficiency is degraded due to alteration of the photochemical electrode.

However, in conventional photochemical electrodes, it is not possible to produce oxygen gas highly efficiently while keeping their chemical stability.

Patent Document 1: International Publication Pamphlet No. WO 2011/089904
Patent Document 2: Japanese Laid-Open Patent Publication No. 2015-98644

SUMMARY

According to an aspect of the embodiments, a photochemical electrode includes: an optical absorption layer; a catalyst layer for oxygen evolution reaction over the optical absorption layer; and a conducting layer over the catalyst layer. A valance band maximum of the catalyst layer is higher than a valance band maximum of the optical absorption layer, and a work function of the conducting layer is larger than a work function of the catalyst layer.

According to another aspect of the embodiments, an oxygen evolution device includes: an aqueous electrolyte; the above-described photochemical electrode in the aqueous electrolyte; and a cathode electrode in the aqueous electrolyte.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments will be specifically described with reference to the attached drawings.

First Embodiment

Figure 1:
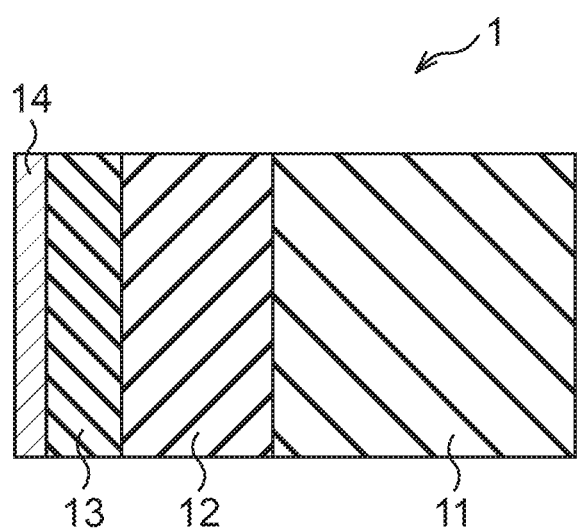
FIG. 1 is a sectional view illustrating a structure of a photochemical electrode according to a first embodiment.
Figure 2:
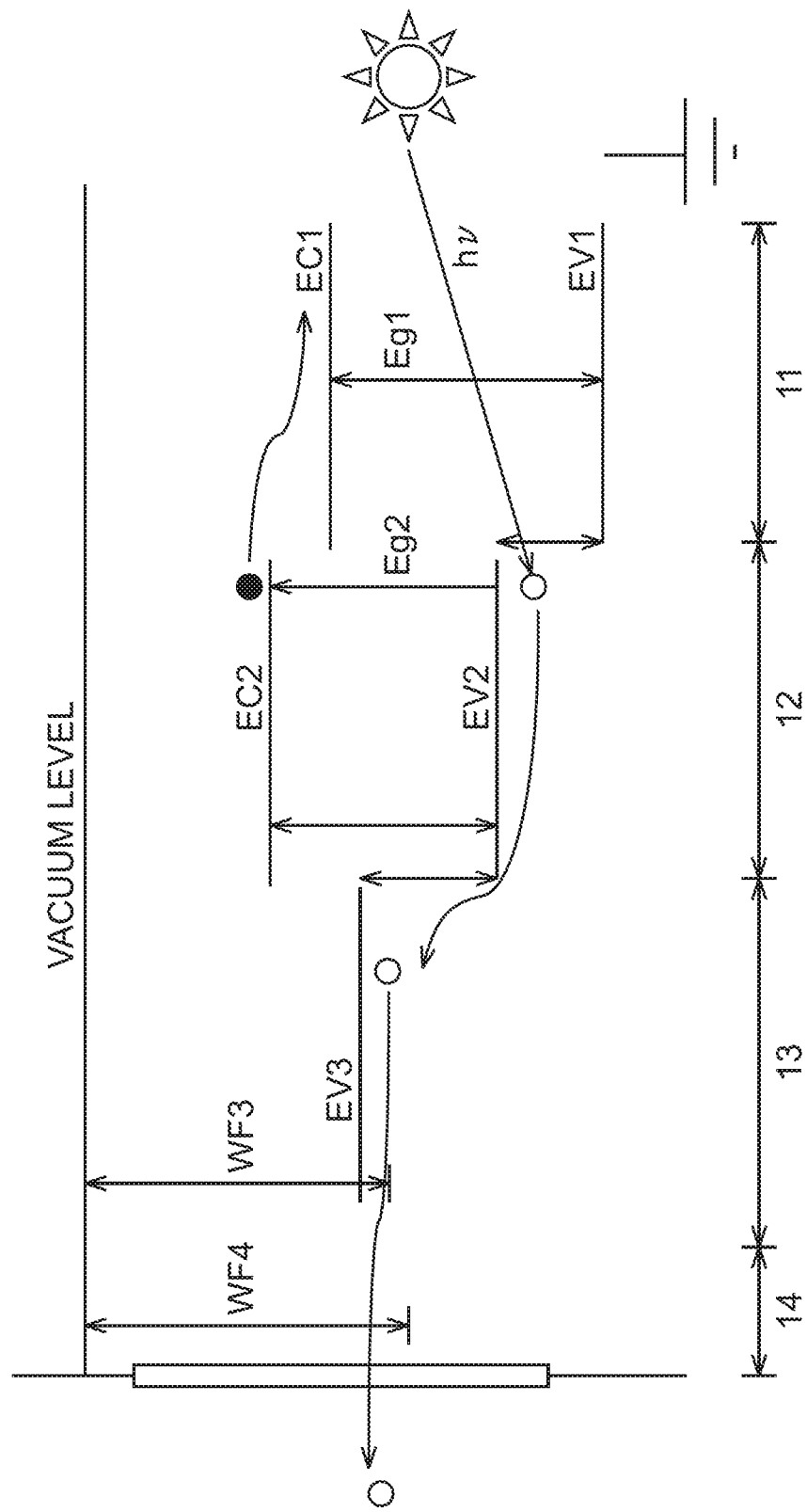
FIG. 2 is a graph illustrating energy relations in the photochemical electrode according to the first embodiment.

First, a first embodiment will be described. The first embodiment is an example of a photochemical electrode. FIG. 1 is a sectional view illustrating a structure of the photochemical electrode according to the first embodiment. FIG. 2 is a graph illustrating energy relations in the photochemical electrode according to the first embodiment.

As illustrated in FIG. 1, the photochemical electrode 1 according to the first embodiment includes an optical absorption layer 12, a catalyst layer 13 for oxygen evolution reaction over the optical absorption layer 12, and a conducting layer 14 over the catalyst layer 13. The photochemical electrode 1 also includes an optical transmission layer 11 in type II heterojunction with the optical absorption layer 12, and the optical absorption layer 12 is over the optical transmission layer 11. As illustrated in FIG. 2, a valence band maximum EV3 of the catalyst layer 13 is higher than a valence band maximum EV2 of the optical absorption layer 12, and a work function WF4 of the conducting layer 14 is larger than a work function WF3 of the catalyst layer 13. The valence band maximum EV2 of the optical absorption layer 12 is higher than a valence band maximum EV1 of the optical transmission layer 11. That is, the valence band maximum becomes higher stepwise from the optical transmission layer 11 toward the catalyst layer 13. Since the optical transmission layer 11 and the optical absorption layer 12 are in type II heterojunction with each other, a conduction band minimum EC2 of the optical absorption layer 12 is higher than a conduction band minimum EC1 of the optical transmission layer 11.

According to this embodiment, as illustrated in FIG. 2, when light incidents the optical transmission layer 11, the light penetrates through the optical transmission layer 11 and is absorbed by the optical absorption layer 12. In the optical absorption layer 12, pairs of electrons and holes are generated, and the holes migrate to the catalyst layer 13. Since the work function of the conducting layer 14 is larger than the work function of the catalyst layer 13, the holes penetrate through the conducting layer 14. When the photochemical electrode 1 is in an aqueous electrolyte, the holes oxidize water on the surface of the conducting layer 14 and oxygen gas is produced.

For example, the optical transmission layer 11 is an undoped $SrTiO_3$ substrate having a 0.3 mm thickness, the optical absorption layer 12 is a $BiFeO_3$ layer having a 100 nm thickness, the catalyst layer 13 is a $La_{89}Sr_{11}CoO_3$ layer having a 15 nm thickness, and the conducting layer 14 is a porous Au layer having a 15 nm thickness. For example, the $BiFeO_3$ layer and the $La_{89}Sr_{11}CoO_3$ layer may be deposited on the $SrTiO_3$ substrate by a pulsed laser deposition (PLD)

method. The porous Au layer may be deposited on the $La_{89}Sr_{11}CoO_3$ layer by a thermal evaporation method at room temperature.

For example, the optical transmission layer 11 is an undoped $SrTiO_3$ substrate having a 0.5 mm thickness, the optical absorption layer 12 is a $BiFeO_3$ layer having a 100 nm thickness, the catalyst layer 13 is a $La_{70}Sr_{30}CoO_3$ layer having a 15 nm thickness, and the conducting layer 14 is a porous Au layer having a 15 nm thickness. For example, the $BiFeO_3$ layer and the $La_{70}Sr_{30}CoO_3$ layer may be deposited on the $SrTiO_3$ substrate by a PLD method. The porous Au layer may be deposited on the $La_{70}Sr_{30}CoO_3$ layer by an evaporation method.

For example, the optical transmission layer 11 is an undoped $SrTiO_3$ substrate having a 0.5 mm thickness, the optical absorption layer 12 is a $BiFeO_3$ layer having a 100 nm thickness, the catalyst layer 13 is a $PrNiO_3$ layer having a 15 nm thickness, and the conducting layer 14 is a porous Au layer having a 15 nm thickness. For example, the $BiFeO_3$ layer and the $PrNiO_3$ layer may be deposited on the $SrTiO_3$ substrate by a PLD method, and the porous Au layer may be deposited on the $PrNiO_3$ layer by an evaporation method.

According to the first embodiment, owing to the presence of the conducting layer 14 over the catalyst layer 13, alternation of the catalyst layer 13 is suppressed even if the catalyst layer 13 is not stable in the aqueous electrolyte. This allows to select a material of the catalyst layer 13 regardless of chemical stability, allowing the use of a highly active material for the catalyst layer 13. Further, the light can be led to the optical absorption layer 12 through the optical transmission layer 11 despite of the presence of the conducting layer 14. This enables the highly efficient use of the light irradiating the photochemical electrode 1.

Figure 3:
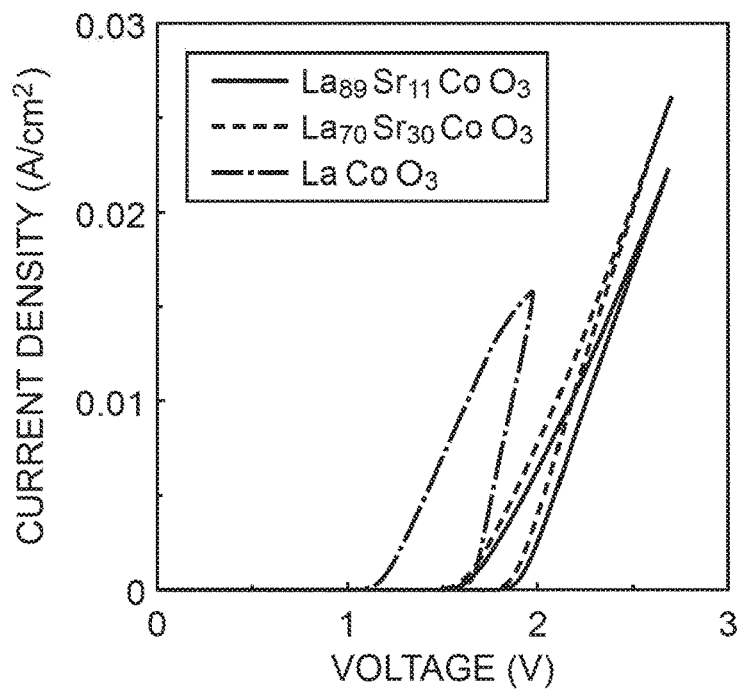
FIG. 3 is a graph illustrating characteristics of $La_{1-x}Sr_xCoO_3$.

Here, characteristics of a catalyst will be described. As illustrated in FIG. 3, $La_{1-x}Sr_xCoO_3$ is useful as a catalyst of the oxygen evolution reaction. $La_{1-x}Sr_xCoO_3$, however, is not chemically stable in an aqueous electrolyte, and if it is directly brought into contact with the aqueous electrolyte, it undergoes alternation to deteriorate in performance. Disposing a conducting layer on a catalyst layer may suppress the alternation. However, the conducting layer lowers a light transmittance to lower use efficiency of light. In this embodiment, since the optical absorption layer 12 is over the catalyst layer 13 on the opposite side of the conducting layer 14, it is possible to avoid the deterioration of the use efficiency of light by irradiating the light from the opposite side of the conducting layer 14.

A band gap Eg1 of the optical transmission layer 11 is preferably 3 eV or more. If the band gap Eg1 is less than 3 eV, the optical transmission layer 11 may absorb the light to decrease an amount of the light reaching the optical absorption layer 12. A band gap Eg2 of the optical absorption layer 12 is preferably 3 eV or less. If the band gap Eg2 is over 3 eV, the optical absorption layer 12 may not be able to absorb the light sufficiently. The band gap Eg2 is preferably not less than 1 eV nor more than 3 eV. If the band gap Eg2 is less than 1 eV, the optical absorption layer 12 may not be able to absorb the light sufficiently, either.

A material of the optical transmission layer 11 is not limited, and the optical transmission layer 11 contains, for example, $SrTiO_3$, $(La_{0.3}Sr_{0.7})(Al_{0.65}Ta_{0.35})O_3$ (LSAT), $LaAlO_3$, MgO, $NdGaO_3$, or $DyScO_3$. A material of the optical absorption layer 12 is not limited, and the optical absorption layer 12 contains, for example, an oxide including a perovskite structure, for example, $BiFeO_3$. A material of the catalyst layer 13 is not limited, and the catalyst layer 13 contains, for example, an oxide of Co or Ni, or both of them. The conducting layer 14 is preferably porous, and is, for example, a porous Au layer.

Second Embodiment

Figure 4:
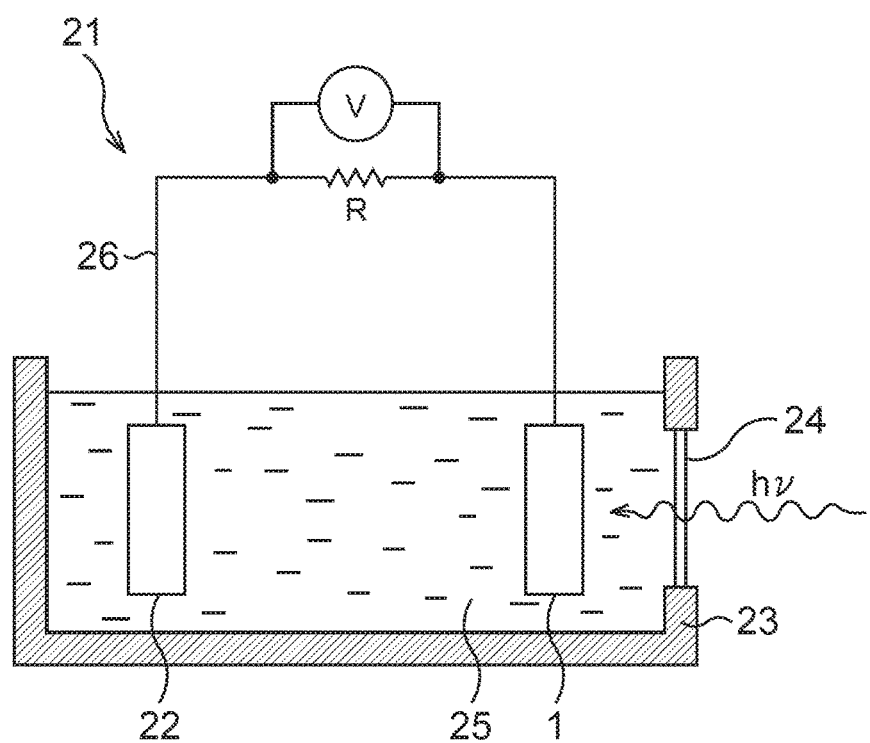
FIG. 4 is a view illustrating a structure of an oxygen evolution device according to a second embodiment.

Next, a second embodiment will be described. The second embodiment relates to an oxygen evolution device including the photochemical electrode 1. FIG. 4 is a view illustrating a structure of the oxygen evolution device according to the second embodiment.

As illustrated in FIG. 4, the oxygen evolution device 21 according to the second embodiment includes an aqueous electrolyte 25 stored in a bath 23, the photochemical electrode 1 according to the first embodiment in the aqueous electrolyte 25, and a cathode electrode 22 in the aqueous electrolyte 25. The photochemical electrode 1 and the cathode electrode 22 are electrically connected to each other through a wiring 26 outside the aqueous electrolyte 25. The bath 23 includes a window 24 that transmits light. The photochemical electrode 1 is disposed such that the light having penetrated through the window 24 irradiates the optical transmission layer 11. The aqueous electrolyte 25 is, for example, an aqueous $Na_2SO_4$ solution.

According to the oxygen evolution device 21, when light irradiates the photochemical electrode 1, pairs of electrons and holes are generated in the optical absorption layer 12, the holes oxidize water on the surface of the conducting layer 14, and oxygen gas is produced, as described above. Owing to the photochemical electrode 1 included therein, it is possible to produce the oxygen gas highly efficiently.

Third Embodiment

Figure 5:
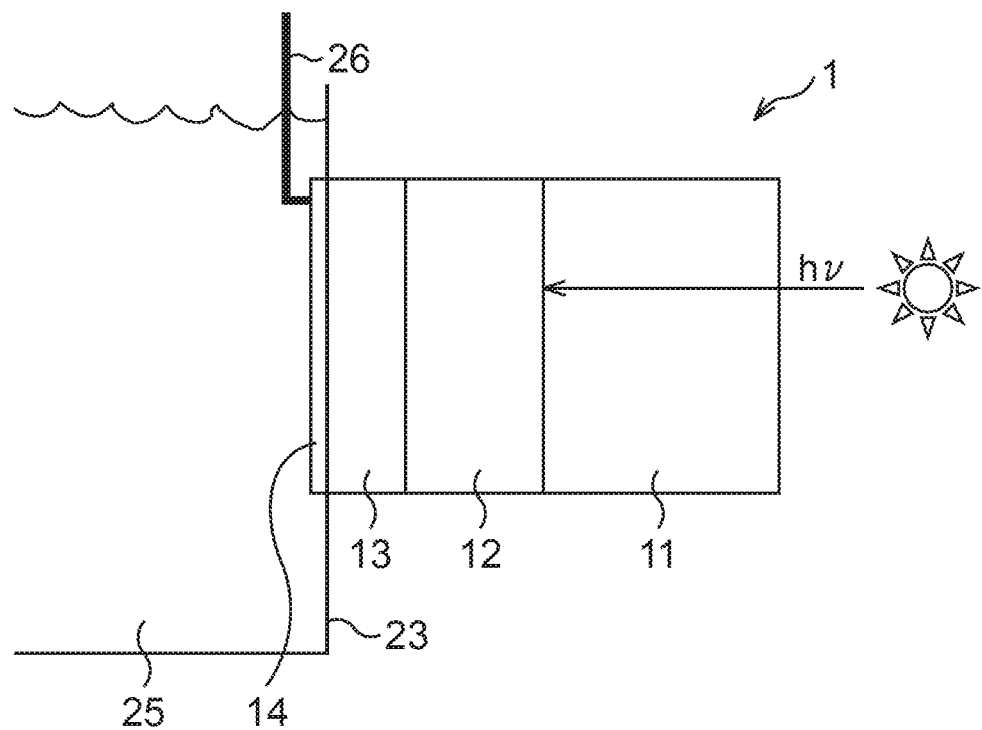
FIG. 5 is a view illustrating a structure of an oxygen evolution device according to a third embodiment.

Next, a third embodiment will be described. The third embodiment relates to an oxygen evolution device including the photochemical electrode 1. FIG. 5 is a view illustrating a structure of the oxygen evolution device according to the third embodiment.

In the oxygen evolution device 31 according to the third embodiment, as illustrated in FIG. 5, the photochemical electrode 1 is attached to the bath 23, with the optical transmission layer 11, the optical absorption layer 12, and the catalyst layer 13 being outside the bath 23, and the conducting layer 14 being inside the bath 23, and this oxygen evolution device 31 does not include the window 24. The other structure is the same as that of the second embodiment.

According to the third embodiment, similarly to the second embodiment, owing to the photochemical electrode 1 according to the first embodiment 1 included therein, it is possible to produce the oxygen gas highly efficiently.

As one aspect, since the appropriate optical absorption layer, catalyst layer, and conducting layer are included, it is possible to produce oxygen gas highly efficiently while keeping chemical stability.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A photochemical electrode comprising:
   an optical absorption layer;
   a $PrNiO_3$ layer which is a catalyst layer for oxygen evolution reaction over the optical absorption layer; and
   a porous Au layer over the $PrNiO_3$ layer, wherein:
   a valance band maximum of the catalyst layer is higher than a valance band maximum of the optical absorption layer; and
   a work function of the porous Au layer is larger than a work function of the $PrNiO_3$ layer.

2. The photochemical electrode according to claim 1, further comprising an optical transmission layer in type II heterojunction with the optical absorption layer, wherein:
   the optical absorption layer is over the optical transmission layer; and
   the valence band maximum of the optical absorption layer is higher than a valence band maximum of the optical transmission layer.

3. The photochemical electrode according to claim 2, wherein a band gap of the optical transmission layer is 3 eV or more.

4. The photochemical electrode according to claim 2, wherein the optical transmission layer contains $SrTiO_3$, $(La_{0.3}Sr_{0.7})(Al_{0.65}Ta_{0.35})O_3$, $LaAlO_3$, MgO, $NdGaO_3$, or $DyScO_3$.

5. The photochemical electrode according to claim 1, wherein a band gap of the optical absorption layer is 3 eV or less.

6. The photochemical electrode according to claim 5, wherein the band gap of the optical absorption layer is not less than 1 eV nor more than 3 eV.

7. The photochemical electrode according to claim 1, wherein the optical absorption layer contains an oxide including a perovskite structure.

8. The photochemical electrode according to claim 1, wherein the optical absorption layer contains an oxide that is $BiFeO_3$.

9. An oxygen evolution device comprising:
   an aqueous electrolyte;
   a photochemical electrode in the aqueous electrolyte; and
   a cathode electrode in the aqueous electrolyte,
   wherein the photochemical electrode comprises:
   an optical absorption layer;
   a $PrNiO_3$ layer which is a catalyst layer for oxygen evolution reaction over the optical absorption layer; and
   a porous Au layer over the catalyst layer, wherein:
   a valance band maximum of the $PrNiO_3$ layer is higher than a valance band maximum of the optical absorption layer; and
   a work function of the porous Au layer is larger than a work function of the $PrNiO_3$ layer.

10. The photochemical electrode according to claim 1, wherein the optical absorption layer is in contact with one surface of the $PrNiO_3$ layer, and the porous Au layer is in contact with the other surface of the $PrNiO_3$ layer.

11. The oxygen evolution device according to claim 9, wherein of the optical absorption layer, the $PrNiO_3$ layer and the porous Au layer, only the porous Au layer is in contact with the aqueous electrolyte.

* * * * *